(12) United States Patent
Wang et al.

(10) Patent No.: US 10,452,312 B2
(45) Date of Patent: Oct. 22, 2019

(54) APPARATUS, SYSTEM, AND METHOD TO DETERMINE A DEMARCATION VOLTAGE TO USE TO READ A NON-VOLATILE MEMORY

(71) Applicant: INTEL CORPORATION, Santa Clara, CA (US)

(72) Inventors: Zhe Wang, Hillsboro, OR (US); Zeshan A. Chishti, Hillsboro, OR (US); Muthukumar P. Swaminathan, Folsom, CA (US); Alaa R. Alameldeen, Hillsboro, OR (US); Kunal A. Khochare, Folsom, CA (US); Jason A. Gayman, Cameron Park, CA (US)

(73) Assignee: INTEL CORPORATION, Santa Clara, CA (US)

( * ) Notice: Subject to any disclaimer, the term of this patent is extended or adjusted under 35 U.S.C. 154(b) by 188 days.

(21) Appl. No.: 15/396,204

(22) Filed: Dec. 30, 2016

(65) Prior Publication Data

US 2018/0188953 A1    Jul. 5, 2018

(51) Int. Cl.
```
G06F 3/06      (2006.01)
G11C 16/34     (2006.01)
G11C 16/26     (2006.01)
```
(52) U.S. Cl.
CPC .......... *G06F 3/0655* (2013.01); *G06F 3/0614* (2013.01); *G06F 3/0658* (2013.01);
(Continued)

(58) Field of Classification Search
None
See application file for complete search history.

(56) References Cited

U.S. PATENT DOCUMENTS 5,204,958 A * 4/1993 Cheng ................. G06F 16/9027
9,208,871 B2   12/2015 Bandic et al.
(Continued)

FOREIGN PATENT DOCUMENTS

WO     2012/177534    12/2012

OTHER PUBLICATIONS

Hyeontaek Lim, Bin Fan, David G. Andersen, and Michael Kaminsky. 2011. SILT: a memory-efficient, high-performance key-value store. In Proceedings of the Twenty-Third ACM Symposium on Operating Systems Principles (SOSP '11). ACM, New York, NY, USA, 1-13. (Year: 2011).*

*Primary Examiner* — Edward J Dudek, Jr.
*Assistant Examiner* — Ralph A Verderamo, III
(74) *Attorney, Agent, or Firm* — Konrad Raynes Davda & Victor LLP; David W. Victor

(57) ABSTRACT

Provided are an apparatus, system and method to determine whether to use a low or high read voltage. First level indications of write addresses, for locations in the non-volatile memory to which write requests have been directed, are included in a first level data structure. For a write address of the write addresses having a first level indication in the first level data structure, the first level indication of the write address is removed from the first level data structure and a second level indication for the write address is added to a second level data structure to free space in the first level data structure to indicate a further write address. A first voltage level is used to read data from read addresses mapping to one of the first and second level indications in the first and the second level data structures, respectively. A second voltage level is used to read data from read addresses that do not map to one of the first and the second level indications the first and second level data structures, respectively.

25 Claims, 6 Drawing Sheets

(52) U.S. Cl.
CPC ............ *G06F 3/0679* (2013.01); *G11C 16/26* (2013.01); *G11C 16/3404* (2013.01); *G11C 16/3418* (2013.01)

(56) References Cited

U.S. PATENT DOCUMENTS

| | | | |
|---|---|---|---|
| 2007/0079071 A1* | 4/2007 | Saha | G06F 5/14 711/118 |
| 2007/0113031 A1* | 5/2007 | Brown | G06F 12/023 711/160 |
| 2013/0194865 A1 | 8/2013 | Bandic et al. | |
| 2014/0006696 A1* | 1/2014 | Ramanujan | G11C 13/0004 711/103 |
| 2015/0179274 A1* | 6/2015 | Kim | G11C 16/3418 711/103 |
| 2016/0364395 A1* | 12/2016 | Shorten | G06F 17/30085 |

\* cited by examiner

Address Components

First Level Data Structure

APPARATUS, SYSTEM, AND METHOD TO DETERMINE A DEMARCATION VOLTAGE TO USE TO READ A NON-VOLATILE MEMORY

TECHNICAL FIELD

Embodiments described herein generally relate to an apparatus, system and method for reliably reading data stored in non-volatile memory.

BACKGROUND

Solid state storage devices (for example, solid state drives or SSDs) may be comprised of one or more packages of non-volatile memory dies implementing NAND memory cells, where each die is comprised of storage cells, where storage cells are organized into pages and pages are organized into blocks. Each storage cell can store one or more bits of information. Over time, a threshold voltage or resistance drift may occur in the memory cells where the resistance of the memory cells increases. As drift occurs, the read voltage used in the early life of the SSD is unable to read the data in the NAND memory cells. As resistance increases, a higher voltage is applied to read data from the non-volatile memory cells. Other types of memory devices, such as phase change memory (PCM) cells, can experience drift, and may require a use of a higher voltage to read data if a memory cell has not been programmed within a predetermined time.

There is a need in the art for improved techniques for determining a read voltage to use to read data in memory cells.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

Figure 1:
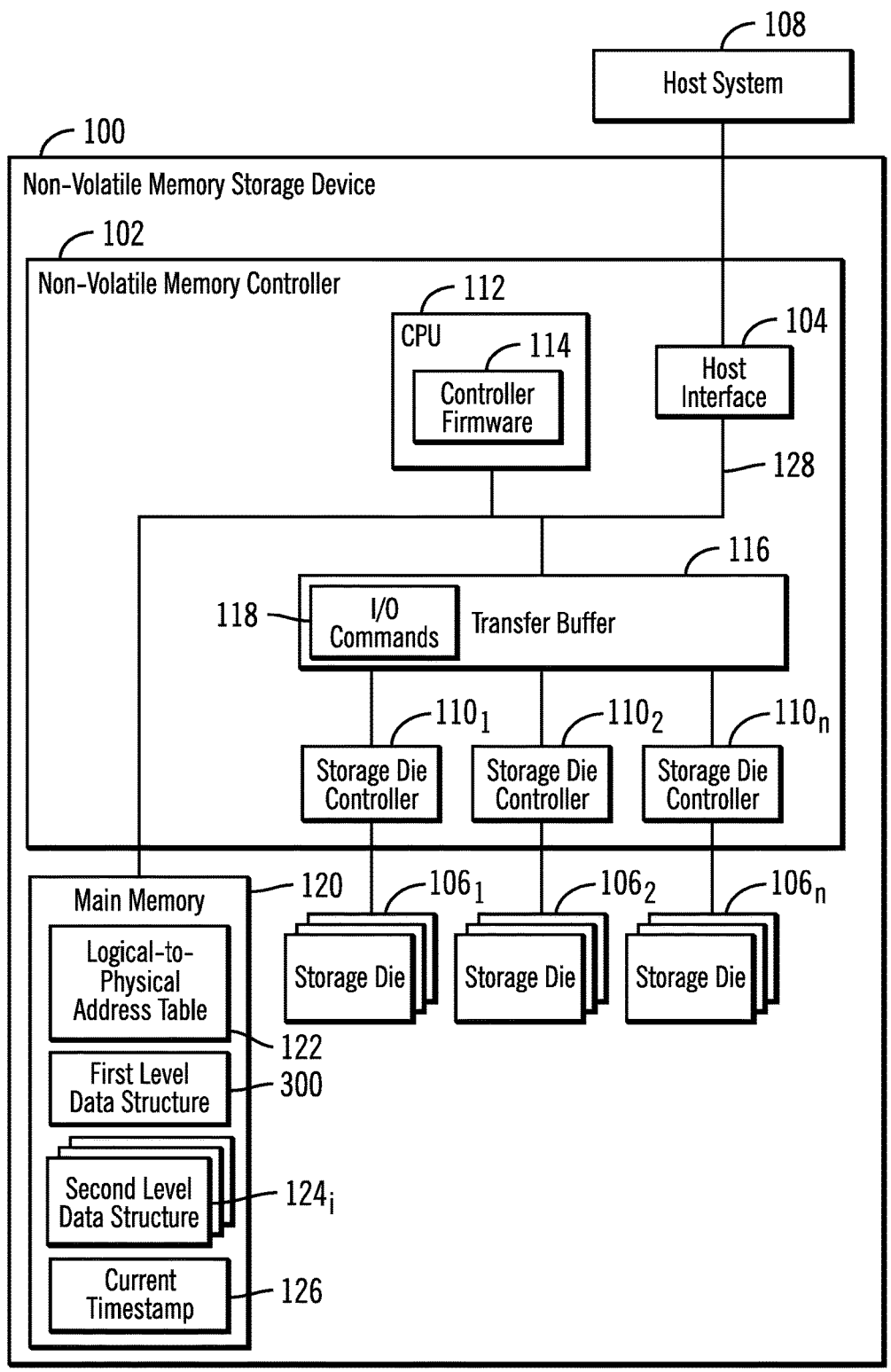
FIG. 1 illustrates an embodiment of a non-volatile memory storage device.

Described embodiments provide techniques for tracking whether an address of a memory cell in a non-volatile memory storage device has been written to within a time window from a current time, such that if there is a read to an address written within the time window, a first voltage level is used to read data for the address. If there is a read to an address written outside of the time window, then a second voltage level is used to read the data due to drift in the resistance of the memory cell experienced as a result of a write not occurring within the time window, where the second voltage level is higher than a first voltage level to have the capability to read data from a memory cell experiencing drift. Described embodiments utilize multiple levels of data structures to provide indication of those addresses written to within the time window that do not have entries for all possible addresses in the non-volatile memory device. Indication of addresses written within the time window are moved between the data structures to ensure that there is indication of all addresses written to within the time window.

The time window comprises a time from a write to the address at which there is not sufficient drift in the resistance of the charged stored in the memory cell to require the second high voltage level to read. Further, using the second high voltage level to read a memory location at an address written to within the time period could damage the data at the location in the memory cell for the read address. With the described embodiments, data that possibly could have been written to within the time window is indicated in the data structures to ensure that the first low voltage threshold is used if there is a possibility that the read address could have been written to within the time window. The second higher voltage level is used if it is certain the read address was not written to within the time window and not indicated in the levels of data structures.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a non-volatile memory storage device 100 having a non-volatile memory controller 102, including a host interface 104 to transfer blocks of data and I/O commands between a plurality of groups of storage dies $106_1, 106_2 \ldots 106_n$, comprising a non-volatile memory of storage cells that may be organized into pages of storage cells, where the pages are organized into blocks, and a connected host system 108. The non-volatile memory storage device 100 includes storage die controllers $110_1, 110_2 \ldots 110_n$ that manage read and write requests to blocks of data in pages of storage cells to groups of the storage dies $106_1, 106_2 \ldots 106_n$ and the transfer of data between the transfer buffer 116 and the storage dies $106_1, 106_2 \ldots 106_n$.

The non-volatile memory storage device 100 may function as both a memory device and/or a storage device in a computing system, and may be used to perform the role of volatile memory devices and non-volatile storage media in a computing system. In an embodiment, the non-volatile memory storage device 100 may comprise a non-volatile memory storage device.

The non-volatile memory controller 102 may include a central processing unit (CPU) 112 implementing controller firmware 114 managing the operations of the non-volatile memory storage device 100; and a non-volatile transfer buffer 116 comprising a non-volatile memory device to cache and buffer transferred Input/Output ("I/O") commands 118 and data between the host 108 and storage dies $106_1, 106_2 \ldots 106_n$. The transfer buffer 116 may comprise a Static Random Access Memory (SRAM) or other suitable volatile or non-volatile memory storage device.

A main memory 120 stores a logical-to-physical address table 122 providing a mapping of logical addresses to which I/O requests are directed and physical addresses in the storage dies $106_1, 106_2 \ldots 106_n$ at which the data for the logical addresses are stored The logical addresses may comprise logical block address (LBAs) or other logical addresses known in the art. The main memory 120 further maintains a first level data structure 300, that indicates write addresses for write requests and a timestamp when the write address was indicated in the first level data structure 300, and second level data structures 124*i*.

There may be one second level data structure for each of the n portions of a time window, such that there are n or more second level data structures $124_i$. The second level data structures $124_i$ may each include a list of indications of addresses removed from the first level data structure 300 to make space in the first level data structure 300 for new write addresses, where each second level data structure $124_i$ indicates write addresses that have been written to within a portion of the time window. Using more second level data structures $124_i$ for a fixed number of portions of the time window reduces the number of indications of write addresses in each second level data structure $124_i$, thus reducing the size needed for each second level data structure $124_i$.

For read requests to addresses that have been written to within a time window, a first voltage level may be used to read the data for the address in the storage dies $106_1, 106_2 \ldots 106_n$ because the charge in the memory cell location at such addresses written to within the time window would not have experienced sufficient resistance drift to require use of the high voltage level. A second voltage level, greater than the first voltage level, needs to be used to read data for those addresses that were last written more than the time window ago because the memory cells storing the data for these addresses would have experienced resistance drift. The time window indicates a time from the last write during which the lower first voltage may be used, whereas after the time window from the last time the memory cell was written, the higher second voltage level needs to be used.

In certain phase change memory (PCM) and other memory and storage embodiments, the first voltage level may comprise a demarcation voltage or operating voltage valid during a primary usage period. After the useful life of the device, a higher voltage, such as the second voltage level, may be needed to read from the memory cell that has aged past a useful life time period since it was last programmed.

Addresses to read that are indicated in the first level data structure 300 or one of the second level data structures $124_i$ have possibly been written to within the time window and, thus, the first voltage level may be used to read the data. If an address to read is not indicated in the first level data structure 300 or one of the second level data structures $124_i$, then the memory cell having the data for that address has not been written to within the time window and the second voltage level should be used.

In described embodiments, the absence of indication of an address in the first level data structure 300 or one of the second level data structures $124_i$ guarantees that the memory cell having the data for the address has not been written to within the time window. However, the presence of indication of an address in the first level data structure 300 or one of the second level data structures $124_i$ indicates a possibility that the memory cell having the data for the address has been written to within the time window.

If there is a possibility that the memory cell having the data to read has been written to within the time window, then the first voltage level should be used to attempt to read the data, because using the second level voltage, which is higher than the first level voltage, to read a memory cell that was written to within the time period would damage the data in the memory cell. If the lower first voltage level is tried and the memory cell has in fact not been written to within the time window, then there is no damage to the data in the memory cell, and the second higher voltage level can then be used to read the data from the memory cell having a higher resistance. In this way, the described embodiments ensure that there are no false negatives, i.e., determination that the address has not been written within the time window when it fact it has been written to within the time window of no resistance drift, but accept a small number of false positives, i.e., a determination that the address has been written within the window when it fact it has not been written to within the time window.

The storage dies $106_1, 106_2 \ldots 106_n$, transfer buffer 116, and main memory 120 may comprise electrically erasable and non-volatile memory cells, such as NAND dies (e.g., single level cell (SLC), multi-level cell (MLC), triple level cell (TLC) NAND memories, etc.), a ferroelectric random-access memory (FeTRAM), nanowire-based non-volatile memory, three-dimensional (3D) Xpoint (crosspoint) memory such as phase change memory (PCM), memory that incorporates memristor technology, Magnetoresistive random-access memory (MRAM), Spin Transfer Torque (STT)-MRAM, SRAM, and other electrically erasable programmable read only memory (EEPROM) type devices. The storage dies $106_1, 106_2 \ldots 106_n$, transfer buffer 116, and main memory 120 may comprise different types of memory devices, where the storage dies $106_1, 106_2 \ldots 106_n$ provide more storage space than the transfer buffer 116, which provides a cache for the storage dies $106_1, 106_2 \ldots 106_n$, and the main memory 120, which stores information used for processing I/O requests.

In one embodiment, the storage dies $106_1, 106_2 \ldots 106_n$ may comprise NAND storage, 3D Xpoint memory, PCM memory, etc.; the transfer buffer 116 may comprise an SRAM; and the main memory 120 may comprise a Dynamic Random Access Memory (DRAM), which may be battery backed-up, or a 3D Xpoint memory. In certain embodiments, the main memory 120 may comprise a non-volatile memory storage device 100 of the described embodiments within another non-volatile memory storage device 100.

The host interface 104 connects the non-volatile memory storage device 100 to a host system 108. The non-volatile memory storage device 100 may be installed or embedded within the host system 108, such as shown and described with respect to element 708 or 710 in FIG. 7, or the non-volatile memory storage device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

The CPU 112, host interface 104, and transfer buffer 116 may communicate over one or more bus interfaces 128, such as a PCIe or other type of bus or interface. Data may be transferred among the host interface 104, CPU 112, and transfer buffer 116 over the bus 128 using Direct Memory Access (DMA) transfers, which bypass the CPU 112. Alternatively, the CPU 112 may be involved in transferring data among the host interface 104, transfer buffer 116, and storage dies $106_1$, $106_2$ ... $106_n$ over the bus 128. In FIG. 1, the connection between the units is shown as a bus 128. In alternative embodiments the connection among any of the components 104, 112, 116, and 120 may comprise direct lines or paths and not a shared bus.

Figure 2:
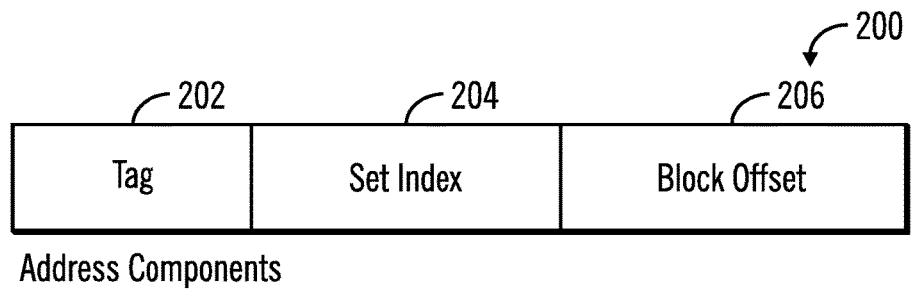
FIG. 2 illustrates a prior art arrangement of a logical address.

FIG. 2 illustrates a prior art format of a logical address 200 to which host 108 read and write requests are directed, and includes a tag portion 202, which may comprise a unique portion of the address of addresses that map to a set of a set associative cache, a set index 204 indicating a set of a set associative cache to which the address 200 maps, and a block offset 206 from that address to find the data within a cache block identified by the tag 202 and set index 204 portions of the address. In described embodiments, the tag 202 and set index 204 are used to indicate an address in the first 300 and second level data structure $124_i$.

Figure 3:
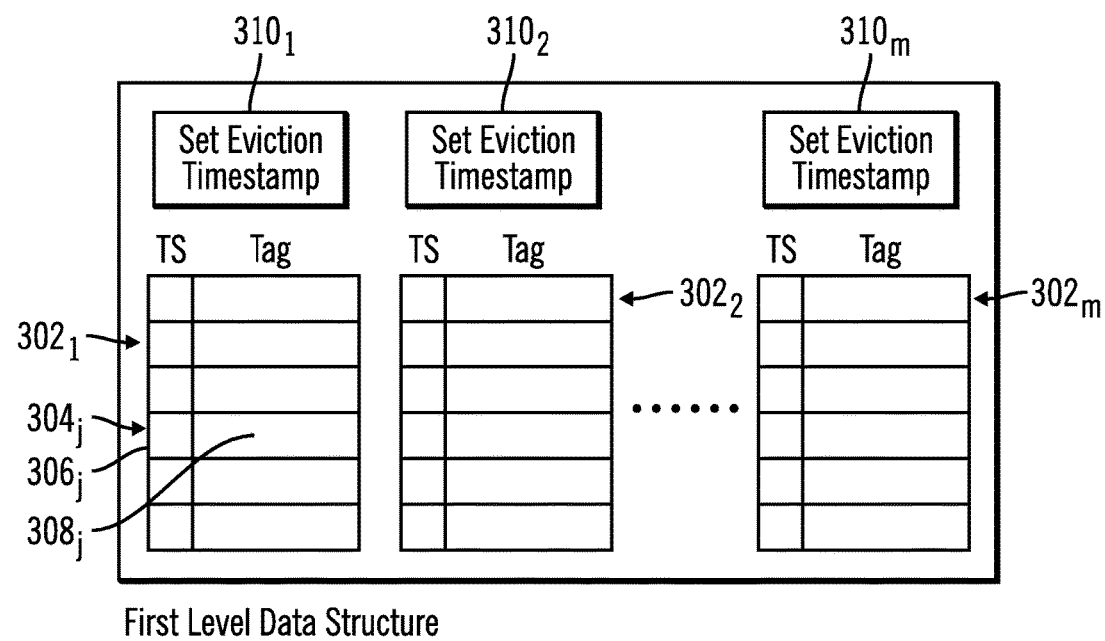
FIG. 3 illustrates an embodiment of a first level data structure to provide information on written addresses. .

FIG. 3 illustrates an embodiment of the first level data structure 300, which includes a plurality of sets of entries $302_1$, $302_2$ ... $302_m$, such that the set index 204 of a logical address maps to one of the sets of entries $302_1$, $302_2$ ... $302_m$. Each entry $304_j$ in a set includes a timestamp portion $306_j$ indicating a current timestamp when the address was indicated in the set $302_i$ of entries, and a tag $308_j$ of the write address $200_w$ being written. A set eviction timestamp $310_1$, $310_2$ ... $310_m$ indicates a timestamp $306_j$ for an indicated address most recently removed from the corresponding set of entries $302_1$, $302_2$ ... $302_m$.

A current timestamp 126 indicates a current time to be used when indicating a timestamp $306_j$ for a write address indicated in an entry $304_j$ in the first level data structure 300. In embodiments, where there are n possible portions of a time window (the time during which the first low voltage may be used to read) in which to group timestamps of write requests, a time period comprises the time window divided by n, or the number of n portions of the time window. In such embodiments, there may be n+1 timestamps, such that reaching the (n+1)th timestamp indicates write addresses $200_w$ written to outside of the time window, for which the second high voltage must be used to read. A timestamp $306_j$ value of zero for an entry $304_j$ for a write address, in certain embodiments, may indicate an expired timestamp.

Figure 4:
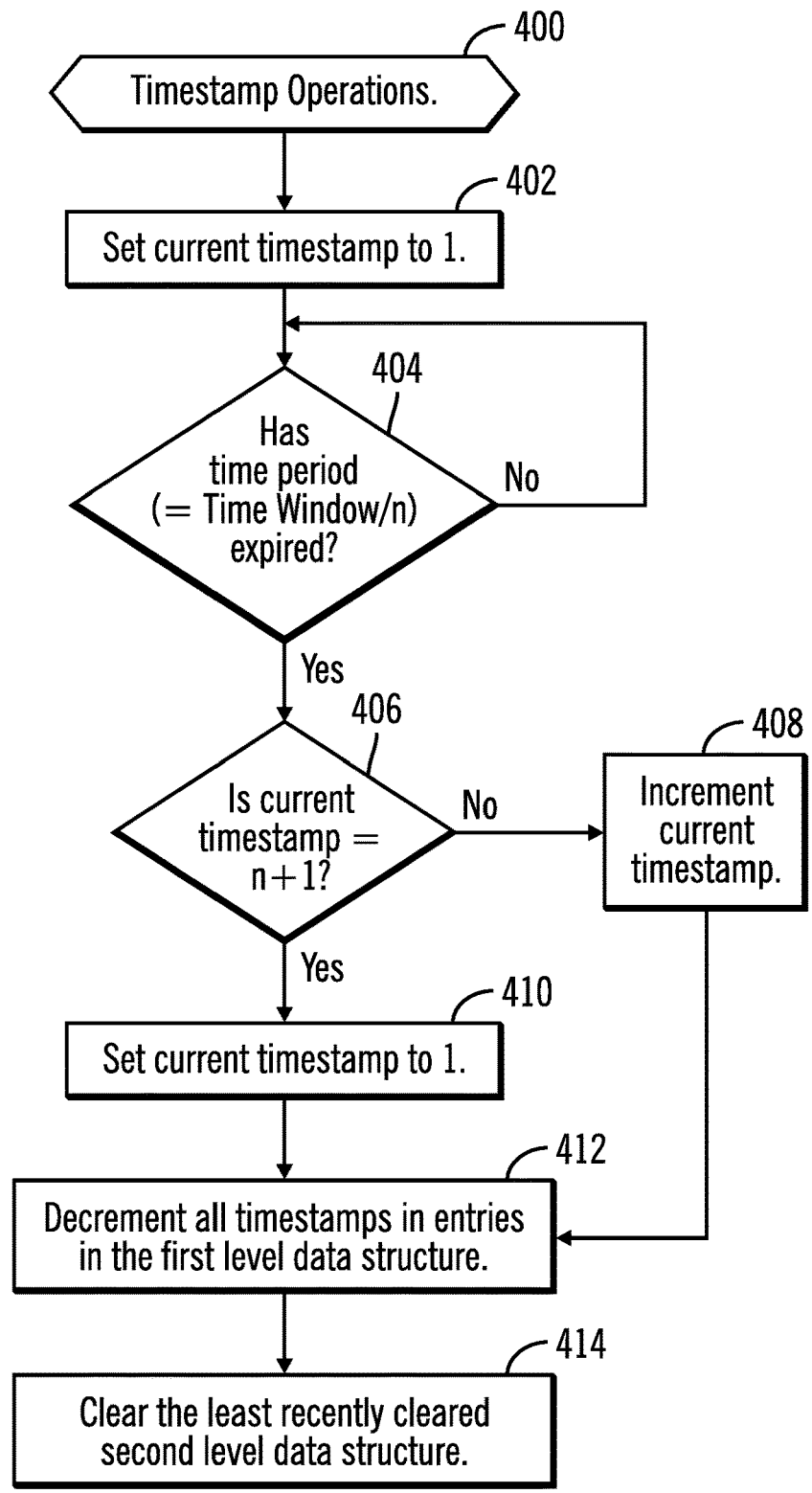
FIG. 4 illustrates an embodiment of operations to increment a timestamp.

FIG. 4 illustrates an embodiment of operations performed by the controller firmware 114 to handle timestamp operations every time a time period occurs, i.e., passes. Upon initiating timestamp operation 400 when read and write operations commence, the current timestamp 126 is set (at block 402) to one. Upon a time period, e.g., the time window divided by n (number of timestamps), expiring (at block 404), if (at block 406) the current timestamp 126 does not comprise a last possible timestamp value, e.g., n+1, then the current timestamp 126 is incremented. Otherwise, if (at block 406) the current timestamp 126 is the last possible timestamp value, e.g., n+1, then the current timestamp is set (at block 410) to one, wraps around to the first possible timestamp value. All the timestamps $306_j$ in entries $304_j$ in all the sets $302_1$, $302_2$ ... $302_m$ are decremented (at block 412) by one. The controller firmware 114 further clears (at block 414) the least recently cleared second level data structure $124_i$. After the passing of the time period, the least recently cleared second level data structure $124_i$ would indicate write addresses that were first indicated in the first level data structure 300 more than the time window ago.

FIG. 4 illustrates one embodiment of implementing the timestamps. However, those skilled in the art may appreciate that there alternative ways to implement the timestamps and indicate expired timestamps. In a further embodiment, the value of timestamps may be expired in a round robin fashion. For example, timestamp 0 would expire after a second time period passes, then timestamp 1 expires after the third time period expires, and so on, such that after the passing of the kth time period, all time stamps from 0 to k−2 are considered expired. In this embodiment, there is no need to decrement the timestamps, and the expired timestamps comprise all timestamps more than one timestamp before the timestamp prior to the current timestamp 126.

Figure 5:
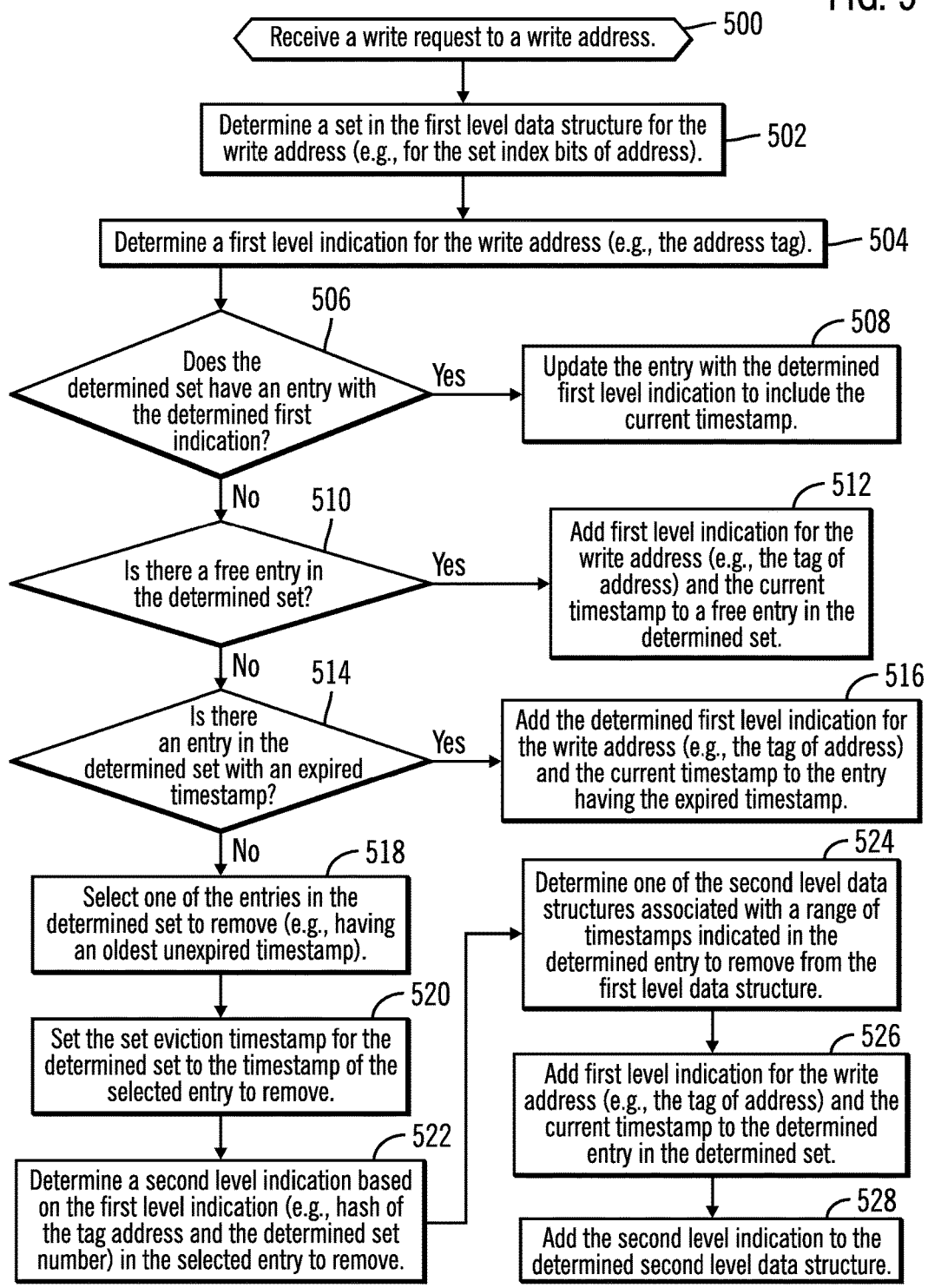
FIG. 5 illustrates an embodiment of operations to process a write request to a write address.

FIG. 5 illustrates an embodiment of operations performed by the controller firmware 114 to process a received write request to a write address $200_w$ indicate in the first level data structure 300. Upon receiving (at block 500) a write request to a write address $200_w$, the controller firmware 114 determines (at block 502) a set $302_i$ in the first level data structure 300 for the write address $200_w$, which may comprise the set $302_i$ identified by the set index portion 204 of the write address $200_w$. A determination is made (at block 504) of a first level indication for the write address 200, which may comprise the address tag 202 of the write address $200_w$. If (at block 506) the determined set $302_i$ has an entry $304_j$ with the determined first level indication, then the entry $304_j$ with the matching first level indication is updated (at block 508) to include the current timestamp 126. If (at block 506) there is no entry $304_j$ in the determined set $302_i$ for the write address $200_w$ with a matching first level indication, then the controller firmware 114 determines (at block 510) whether there is a free entry $304_f$ in the determined data set $302_i$. If so, then the current timestamp 126 and the first level indication for the write address $200_w$ are added (at block 512) to fields $306_f$ and $308_f$ of the free entry $302_f$.

If (at block 510) there is no free entry in the determined set $302_i$, then a determination is made (at block 514) whether there is an entry $302_e$ with an expired timestamp $306_e$. If so, then the current timestamp 126 and the determined first level indication for the write address $200_w$ are added (at block 516) to fields $306_e$ and $308_e$ of the entry $302_e$ having the expired timestamp. If (at block 514) there is no entry in the determined set $302_i$ with an expired timestamp, then there are no entries $304_j$ in the determined set $302_i$ available for reuse, and one of the entries $304_r$ needs to be removed and an entry added to one of the second level data structures $124_i$ for the write address $200_w$ referenced in the entry $304_r$ that is to be removed. To remove one of the entries $304_r$ in the determined set $302_i$, the controller firmware 114 selects (at block 518) one of the entries $304_r$ to remove, which may comprise an entry having an oldest unexpired timestamp $306_r$. The controller firmware 114 sets (at block 520) the set eviction timestamp $310_i$ for the determined set $302_i$ to the timestamp $306_r$ of the selected entry to remove $304_r$.

The controller firmware 114 determines (at block 522) a second level indication based on the first level indication in the entry $304_r$ being removed, which may comprise a hash of the tag address $308_r$ in the entry $304_r$ and the determined set $302_i$ having the entry $304_r$ to remove. A determination is then made (at block 524) of one of the second level data structures $124_i$ associated with a range of timestamps including the timestamp $306_r$ of the entry $304_r$ being removed. The current timestamp 126 and the determined first level indication for the write address $200_w$ (e.g., the address tag 202) are added (at block 526) to the fields $306_r$ and $308_r$ in the entry $304_r$ subject to being removed to represent the new write address $200_w$ being written. The second level indication, representing the write address removed from the first level data structure 300, is added (at block 528) to the second level data structure $124_i$.

With the described embodiments, indications of a write address that have an unexpired timestamp, meaning the write address was written within the time window from the current time 126, are added to one of the second level data structures $124_i$ when removed to make room to indicate a new write address in the first level data structure 300. In this way, a write address having been written within the time window has an indication in one of the data structures 300 or $124_i$ to make sure that the first low voltage level is used to read such addresses that could possibly have been written within the time window.

It is possible that multiple addresses in the storage dies $106_1, 106_2 \ldots 106_n$ could map to one first level indication in the first level data structure 300 and a second level indication in the second level data structure $124_i$. In such case, if an address to read that has not been written within the time window maps to a first or second level indication in one of the data structures 300 and $124_i$, which indicates the address has been written within the time window, then the first low voltage would be used to read such address, and upon failing the read would be retried with the second higher voltage level. Thus, collisions in the data structures $124_i$ and 300 have no negative consequence except having to retry the read with the higher voltage level.

Further, described embodiments conserve space by allowing the use of a first level data structure $300_i$ that may operate as a set associative cache in that multiple of the possible addresses 200 may map to one entry in the first level data structure $300_i$. To allow for new write addresses to be tracked during the time window, entries in the first level data structure $300_i$ may be moved to even smaller second level data structures $124_i$, which further track write addresses that have been written to within the time window in which the lower voltage level must be used. The described embodiments allow data structures to be used to track write addresses while they have been written to within the time window that have far fewer entries than the total number of possible addresses in the storage dies $106_1, 106_2 \ldots 106_n$ to track.

Figure 6:
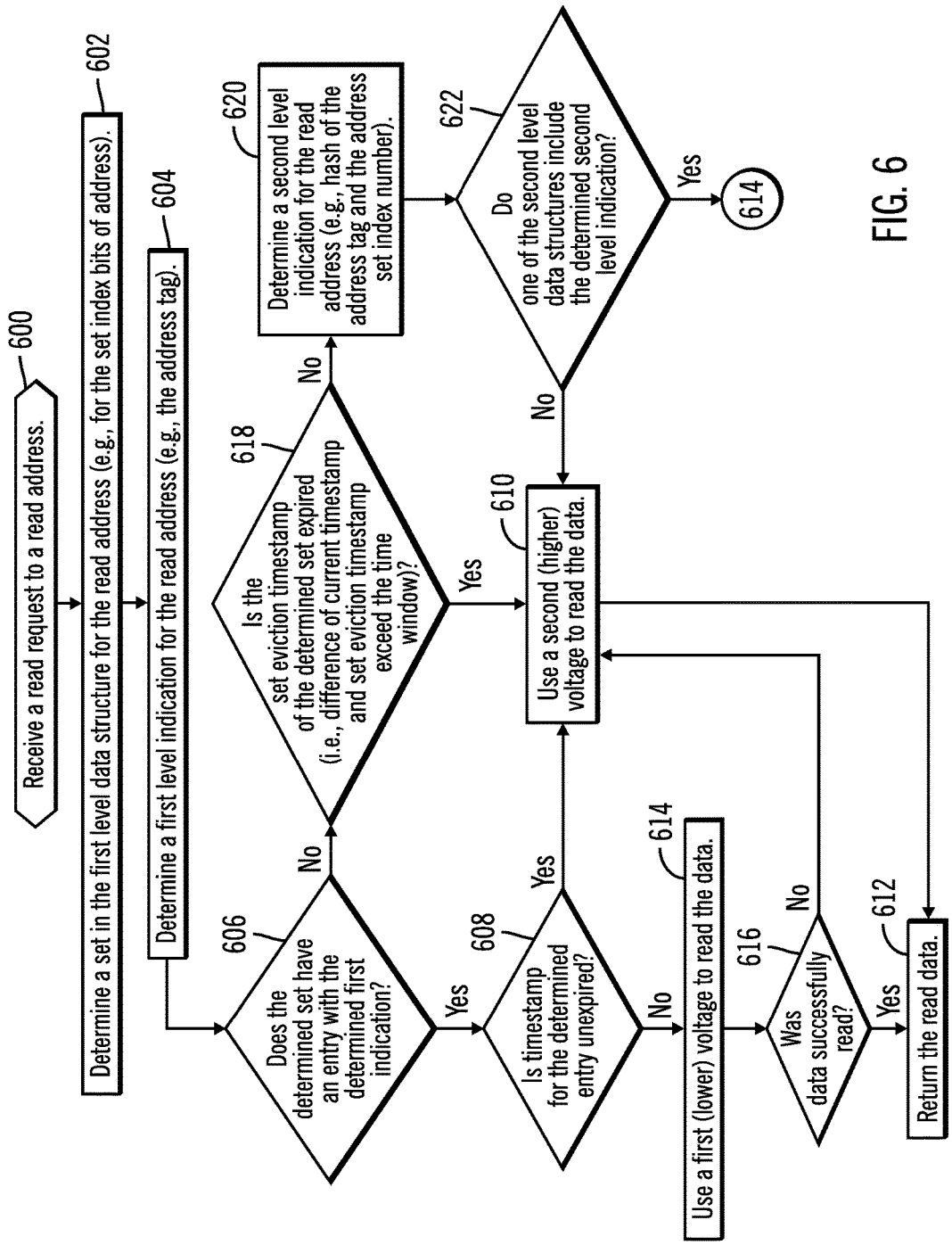
FIG. 6 illustrates an embodiment of operations to process a read request to a read address.

FIG. 6 illustrates an embodiment of operations performed by the controller firmware 114 to process a read request to a read address $200_R$. Upon receiving (at block 600) the read request, a determination is made (at block 602) of a set $302_i$ in the first level data structure 300 for the read address $200_R$, which may comprise the set index bits 204 of the read address $200_R$. A determination is further made (at block 604) of a first level indication of the read address $200_R$, which may comprise the address tag 202. If (at block 606) the determined set $302_i$ has an entry $304_j$ with a first level indication $308_j$ matching the address tag 202 of the read address $200_R$ and if (at block 608) the timestamp $306_j$ for the determined entry $304_j$ has expired, indicating the address associated with the determined entry $304_j$ was not written within the time window, then the second (higher) voltage is used (at block 610) to read the data at the read address $200_R$, and the read data is returned (at block 612).

If (at block 608) the timestamp $306_j$ in the entry to which the read address $200_R$ maps is not expired, then the first (lower) voltage is used (at block 614) to read the data because there is a possibility the location for the read address $200_R$ in the storage dies $106_1, 106_2 \ldots 106_n$ has been written within the time window. If (at block 616) the data was not successfully read, then control proceeds to use (at block 610) the second higher voltage level. If (at block 616) the data was successfully read, then the read data is returned (at block 612). Data may not be successfully read if the first level indication is for another written address that collides in the first level data structure 300 with the read address $200_R$.

If (at block 606) the determined set $302_i$ in the first level data structure 300 does not have an entry $304_j$ with the determined first level indication, e.g., address tag 202, in field $308_j$, then a determination is made as to whether the set eviction timestamp $310_i$ of the determined set $302_i$ is expired, i.e., the set eviction timestamp $310_i$ is more than the time window from the current timestamp 126. Expiration of the set eviction time stamp $310_i$ indicates that the second level data structures $124_i$ would not have a second level indication for the read address $200_R$ with the time window. If (at block 618) the set eviction time stamp $310_i$ is expired, then control proceeds to block 610 to use the second (higher) voltage level to read the data. If (at block 618) the set eviction time stamp $310_i$ has not expired, then a determination is made (at block 620) of a second level indication for the read address $200_R$, which may comprise a hash of the address tag 202 and the set index number 204 for the read address $200_R$. If (at block 622) one of the second level data structures $124_i$ includes the determined second level indication, then control proceeds to block 614 to use the first (low) voltage level. If (at block 622) no second level data structure $124_i$ includes the determined second level indication, then the second (higher) voltage level is used (at block 610) to read the data at the read address $200_R$.

With the described operations of FIG. 6, to determine whether the read address has been written within the time window, requiring use of the first voltage level, a determination is made whether the address is indicated in the first level data structure 300 or one of the second level data structures $124_i$. The set eviction timestamp $310_i$ is used to optimize operations to determine whether to even check the second level data structures $124_i$, because if the set eviction timestamp $310_i$ for the set $302_i$ to which the read address $200_R$ maps has expired, then there would be no entry in one of the second level data structures $124_i$ for the set $302_i$ of the read address $200_R$ indicating the read address $200_R$ was written within the time window.

With the described embodiments, the first 300 and second $124_i$ level data structures are designed such that if a read address $200_R$ does not map to an entry in one of the first 300 and second $124_i$ level data structures, then there is no possibility the read address $200_R$ has been written to within the time window. Further, if a read address $200_R$ maps to one of the first 300 and second $124_i$ level data structures, then there is a possibility that the read address $200_R$ has been written to, which means the first (low) voltage level should be used first to read.

Described embodiments ensure that there are no false negatives, a determination that the address has not been written within the time window when it fact it has been written within the time window, to avoid using the second voltage level when the read address $200_R$ has been written to within the time window. Further, described embodiments permit false positives, a determination that the address has been written within the window when it fact it has not been written to within the time window, so that the first voltage level may be used read data at the read address $200_R$ even if the read address $200_R$ has not been written to within the time window.

Figure 7:
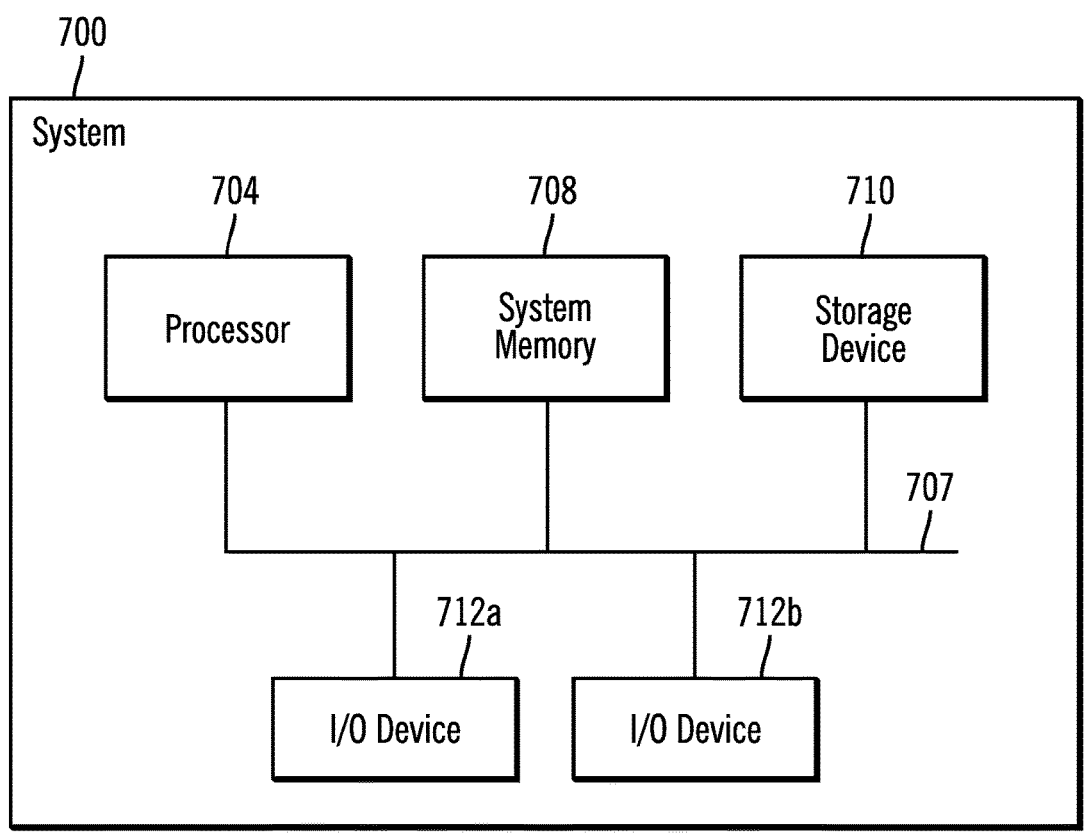
FIG. 7 illustrates an embodiment of a system in which the memory device of FIGS. 1 may be deployed.

FIG. 7 illustrates an embodiment of a system 700 in which the non-volatile memory storage device 100 may be deployed as the system memory device 708 and/or a storage device 710. The system includes a processor 704 that communicates over a bus 706 with a system memory device 708 in which programs, operands and parameters being executed are cached, and a storage device 710, which may comprise a solid state drive (SSD) that stores programs and user data that may be loaded into the system memory 708 for execution. The processor 704 may also communicate with Input/Output (I/O) devices 712a, 712b, which may comprise input devices (e.g., keyboard, touchscreen, mouse, etc.), display devices, graphics cards, ports, network interfaces, etc. The memory 708 and storage device 710 may be coupled to an interface on the system 700 motherboard, mounted on the system 700 motherboard, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i, j, k, m, etc., are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus for determining a voltage to use to reliably read data stored in a non-volatile memory, comprising: a memory controller to: include in a first level data structure, first level indications of write addresses for locations in the non-volatile memory, to which write requests have been directed; for a write address of the write addresses having a first level indication in the first level data structure, remove the first level indication of the write address from the first level data structure and adding a second level indication for the write address to a second level data structure to free space in the first level data structure to indicate a further write address; use a first voltage level to read data from read addresses mapping to one of the first and second level indications in the first and the second level data structures, respectively; and use a second voltage level to read data from read addresses that do not map to one of the first and the second level indications the first and second level data structures, respectively.

In Example 2, the subject matter of examples 1 and 3-13 can optionally include that the first voltage level is used to read data for addresses that could possibly have been written to within a time window from a current time, wherein the second voltage level is used for read data for addresses that could not possibly have been written to within the time window from the current time, wherein the second voltage level is greater than the first voltage level, wherein the memory controller is further to: in response to determining that the use of the first voltage level failed to read data from a read address, use the second voltage level to read the data from the read address.

In Example 3, the subject matter of examples 1, 2 and 4-13 can optionally include that a read address has not been written to within the time window if one of the first and the second level indications for the read address is not indicated in the first and the second level data structures, respectively, and wherein a read address could possibly have been written to within the time window if one of the first and the second level indications for the read address is included in one of the first and the second level data structures, respectively.

In Example 4, the subject matter of examples 1-3 and 5-13 can optionally include that there are n portions of the time window, wherein there are n+1 timestamps, wherein a time period comprises a duration of each of the n portions of the time window, wherein the memory controller is further to: in response to a passing of the time period, decrement timestamps for the first level indications in the first level data structure, wherein a current timestamp to use for a next portion of the time window comprises a next of the 1 through n+1 timestamps, wherein the next timestamp is 1 when the current timestamp is n+1, wherein an expired timestamp has value of zero.

In Example 5, the subject matter of examples 1-4 and 6-13 can optionally include that the first level data structure stores a timestamp with each of the first level indications of the write addresses, wherein the timestamp indicates a portion of a plurality of portions of a time window from a current time during which the first level indication was added to the first level data structure, wherein there are a plurality of second level data structures, wherein the second level indication added to one of the second level data structures is for a write address having a timestamp indicated in the first level data structure within one of the portions of the time window.

In Example 6, the subject matter of examples 1-5 and 7-13 can optionally include that the second level indication is added to one of the second level data structure associated with the portion of the time window including the timestamp of the write address for which the second level indication is being added.

In Example 7, the subject matter of examples 1-6 and 8-13 can optionally include that the memory controller is further to: after a passing of the portion of the time window, clear one of the second level data structures having second level indications for write addresses whose timestamps are prior to the time window from the current time.

In Example 8, the subject matter of examples 1-7 and 9-13 can optionally include that the memory controller is further to: receive a new write request to a new write address for the non-volatile memory, wherein the removing the first level indication from the first level data structure and the adding the second level indication to the second level data structure are performed in response to determining that there is no free entry for the new write address in the first level data structure, wherein a first level indication for the new write address is included in a free entry in the first level data structure.

In Example 9, the subject matter of examples 1-8 and 10-13 can optionally that the memory controller is further to perform: determine whether the first level data structure includes a matching entry matching the first level indication of the new write address; and update the timestamp in the matching entry to that of the timestamp for the new write request, wherein the removing the first level indication and adding the second level indication is performed in response to determining that there is no free entry and no matching entry.

In Example 10, the subject matter of examples 1-9 and 11-13 can optionally include that each address for the non-volatile memory maps to one of a plurality of sets of entries in the first level data structure, and wherein the memory controller is further to: receive a new write request to a new write address used for the non-volatile memory, wherein the removing the first level indication from the first level data structure and the adding the second level indication to the second level data structure are performed in response to determining that there is no free entry in the set of entries to which the new write address maps, wherein a first level indication for the new write address is included in a free entry in the set of entries to which the new write address maps.

In Example 11, the subject matter of examples 1-10 and 12-13 can optionally include that the memory controller is further to: determine whether one of the first level indications in the set of entries to which the new write address maps has an expired timestamp, wherein an entry for the first level indication having the expired timestamp comprises a free entry that can be used to store the first level indication for the new write address.

In Example 12, the subject matter of examples 1-11 and 13 can optionally include that each of the sets of entries has a set eviction timestamp indicating a timestamp of a last first level indication removed from the set of entries in the first level data structure, wherein the adding the second level indication to the second level data structure, for a write address whose first level indication is removed from the first level data structure, is performed in response to determining that the set eviction timestamp is within the time window from the current time.

In Example 13, the subject matter of examples 1-12 can optionally include that addresses include a tag and a set index, wherein the first level indication comprises the tag of the write address and wherein the set index of the write address is used to map the write address to one of a plurality of sets of entries in the first level data structure, wherein the second level indication comprises a hash of the tag and the set index for the first level indication being removed from the first level data structure.

Example 14 is a system for determining a voltage to use to reliably read data stored in a non-volatile memory, comprising: a host computer; and a non-volatile memory storage device coupled to the host computer, wherein the host computer communicates Input/Output (I/O) requests to the non-volatile memory storage device, comprising: non-volatile memory; a memory controller to: include in a first level data structure, first level indications of write addresses, for locations in the non-volatile memory to which write requests have been directed; for a write address of the write addresses having a first level indication in the first level data structure, remove the first level indication of the write address from the first level data structure and adding a second level indication for the write address to a second level data structure to free space in the first level data structure to indicate a further write address; use a first voltage level to read data from read addresses mapping to one of the first and second level indications in the first and the second level data structures, respectively; and use a second voltage level to read data from read addresses that do not map to one of the first and the second level indications the first and second level data structures, respectively.

In Example 15, the subject matter of examples 14 and 16-19 can optionally include that the first voltage level is used to read data for addresses that could possibly have been written to within a time window from a current time, wherein the second voltage level is used for read data for addresses that could not possibly have been written to within the time window from the current time, wherein the second voltage level is greater than the first voltage level, wherein the memory controller is further to: in response to determining that the use of the first voltage level failed to read data from a read address, use the second voltage level to read the data from the read address.

In Example 16, the subject matter of examples 14, 15, and 17-19 can optionally include that the first level data structure stores a timestamp with each of the first level indications of the write addresses, wherein the timestamp indicates a portion of a plurality of portions of a time window from a current time during which the first level indication was added to the first level data structure, wherein there are a plurality of second level data structures, wherein the second level indication added to one of the second level data structures is for a write address having a timestamp indicated in the first level data structure within one of the portions of the time window.

In Example 17, the subject matter of examples 14-16 and 18-19 can optionally include that the memory controller is further to: after a passing of the portion of the time window, clear one of the second level data structures having second level indications for write addresses whose timestamps are prior to the time window from the current time.

In Example 18, the subject matter of examples 14-17 and 19 can optionally include that each address for the non-volatile memory maps to one of a plurality of sets of entries in the first level data structure, and wherein the memory controller is further to: receive a new write request to a new write address used for the non-volatile memory, wherein the removing the first level indication from the first level data structure and the adding the second level indication to the second level data structure are performed in response to determining that there is no free entry in the set of entries to which the new write address maps, wherein a first level indication for the new write address is included in a free entry in the set of entries to which the new write address maps.

In Example 19, the subject matter of examples 14-18 can optionally include that each of the sets of entries has a set eviction timestamp indicating a timestamp of a last first level indication removed from the set of entries in the first level data structure, wherein the adding the second level indication to the second level data structure, for a write address whose first level indication is removed from the first level data structure, is performed in response to determining that the set eviction timestamp is within the time window from the current time.

Example 20 is a method for determining a voltage to use to reliably read data stored in a non-volatile memory, comprising: including in a first level data structure, first level indications of write addresses, for locations in the non-volatile memory to which write requests have been directed; for a write address of the write addresses having a first level indication in the first level data structure, removing the first level indication of the write address from the first level data structure and adding a second level indication for the write address to a second level data structure to free space in the first level data structure to indicate a further write address; using a first voltage level to read data from read addresses mapping to one of the first and second level indications in the first and the second level data structures, respectively; and using a second voltage level to read data from read addresses that do not map to one of the first and the second level indications the first and second level data structures, respectively.

In Example 21, the subject matter of examples 20 and 22-25 can optionally include that the first voltage level is used to read data for addresses that could possibly have been written to within a time window from a current time, wherein the second voltage level is used for read data for addresses that could not possibly have been written to within the time window from the current time, wherein the second voltage level is greater than the first voltage level, further comprising: in response to determining that the use of the first voltage level failed to read data from a read address, using the second voltage level to read the data from the read address.

In Example 22, the subject matter of examples 20, 21, and 23-25 can optionally include the first level data structure stores a timestamp with each of the first level indications of the write addresses, wherein the timestamp indicates a portion of a plurality of portions of a time window from a current time during which the first level indication was added to the first level data structure, wherein there are a plurality of second level data structures, wherein the second level indication added to one of the second level data structures is for a write address having a timestamp indicated in the first level data structure within one of the portions of the time window.

In Example 23, the subject matter of examples 20-22 and 24-25 can optionally include that after a passing of the portion of the time window, clearing one of the second level data structures having second level indications for write addresses whose timestamps are prior to the time window from the current time.

In Example 24, the subject matter of examples 20-23 and 25 can optionally include that each address for the non-volatile memory maps to one of a plurality of sets of entries in the first level data structure, and further comprising: receiving a new write request to a new write address of the addresses used for the non-volatile memory, wherein the removing the first level indication from the first level data structure and the adding the second level indication to the second level data structure are performed in response to determining that there is no free entry in the set of entries to which the new write address maps, wherein a first level indication for the new write address is included in a free entry in the set of entries to which the new write address maps.

In Example 25, the subject matter of examples 20-24 can optionally include that each of the sets of entries has a set eviction timestamp indicating a timestamp of a last first level indication removed from the set of entries in the first level data structure, wherein the adding the second level indication to the second level data structure, for a write address whose first level indication is removed from the first level data structure, is performed in response to determining that the set eviction timestamp is within the time window from the current time.

Example 26 is an apparatus for determining a voltage to use to reliably read data stored in a non-volatile memory, comprising: means for including in a first level data structure, first level indications of write addresses, for locations in the non-volatile memory to which write requests have been directed; means for removing, for a write address of the write addresses having a first level indication in the first level data structure, the first level indication of the write address from the first level data structure and adding a second level indication for the write address to a second level data structure to free space in the first level data structure to indicate a further write address; means for using a first voltage level to read data from read addresses mapping to one of the first and second level indications in the first and the second level data structures, respectively; and means for using a second voltage level to read data from read addresses that do not map to one of the first and the second level indications the first and second level data structures, respectively.

Example 27 is an apparatus comprising means to perform a method as claimed in any preceding claim.

Example 28 is a machine-readable storage including machine-readable instructions, when executed, to implement a method or realize an apparatus as claimed in any preceding claim.

What is claimed:

1. An apparatus for reading data written to a non-volatile memory, comprising:
a memory controller to:
include in a first level data structure first level indications of write addresses for locations in the non-volatile memory to which write requests have been directed;
select a write address of the write addresses having a first level indication in the first level data structure based on a timestamp of the selected write address indicated in the first level data structure in response to there being no free entry in the first level data structure for a write address of a received write request;
remove the first level indication of the selected write address from the first level data structure;
add a second level indication for the selected write address to a second level data structure to free space in the first level data structure to indicate the write address for the received write request;
use a first voltage level to read data from read addresses mapping to one of the first and second level indications in the first and the second level data structures, respectively; and
use a second voltage level to read data from read addresses that do not map to one of the first and the second level indications the first and second level data structures, respectively.

2. The apparatus of claim 1, wherein the first voltage level is used to read data for addresses that could possibly have been written to within a time window from a current time, wherein the second voltage level is used to read data for addresses that could not possibly have been written to within the time window from the current time, wherein the second voltage level is greater than the first voltage level, wherein the memory controller is further to:

in response to determining that the use of the first voltage level failed to read data from a read address, use the second voltage level to read the data from the read address.

3. The apparatus of claim 2, wherein a read address has not been written to within the time window if one of the first and the second level indications for the read address is not indicated in the first and the second level data structures, respectively, and wherein a read address could possibly have been written to within the time window if one of the first and the second level indications for the read address is included in one of the first and the second level data structures, respectively.

4. The apparatus of claim 2, wherein there are n portions of the time window, wherein there are n+1 timestamps, wherein a time period comprises a duration of each of the n portions of the time window, wherein the memory controller is further to:
 in response to a passing of the time period, decrement timestamps for the first level indications in the first level data structure, wherein a current timestamp to use for a next portion of the time window comprises a next of 1 through n+1 timestamps, wherein the next timestamp is 1 when the current timestamp is n+1, wherein an expired timestamp has value of zero.

5. The apparatus of claim 1, wherein the first level data structure stores a timestamp with each of the first level indications of the write addresses, wherein the timestamp indicates a portion of a plurality of portions of a time window from a current time during which the first level indication was added to the first level data structure, wherein there are a plurality of second level data structures, wherein the second level indication added to one of the second level data structures is for a write address having a timestamp indicated in the first level data structure within one of the portions of the time window.

6. The apparatus of claim 5, wherein the second level indication is added to one of the second level data structures associated with the portion of the time window including the timestamp of the write address for which the second level indication is being added.

7. The apparatus of claim 5, wherein the memory controller is further to:
 after a passing of the portion of the time window, clear one of the second level data structures having second level indications for write addresses whose timestamps are prior to the time window from the current time.

8. The apparatus of claim 5, wherein a first level indication for the write address for the received write request is included in a free entry in the first level data structure.

9. The apparatus of claim 8, wherein the memory controller is further to perform:
 determine whether the first level data structure includes a matching entry matching the first level indication of the write address for the received write request; and
 update the timestamp in the matching entry to that of the timestamp for the received write request, wherein the selecting the write address, the removing the first level indication, and adding the second level indication are performed in response to determining that there is no free entry and no matching entry.

10. The apparatus of claim 5, wherein each address for the non-volatile memory maps to one of a plurality of sets of entries in the first level data structure, and wherein the memory controller is further to:
 wherein the selecting the write address, the removing the first level indication from the first level data structure, and the adding the second level indication to the second level data structure are performed in response to determining that there is no free entry in the set of entries to which a new write address maps, wherein a first level indication for the new write address is included in a free entry in the set of entries to which the new write address maps.

11. The apparatus of claim 10, wherein the memory controller is further to:
 determine whether one of the first level indications in the set of entries to which the new write address maps has an expired timestamp, wherein an entry for the first level indication having the expired timestamp comprises a free entry that can be used to store the first level indication for the new write address.

12. The apparatus of claim 10, wherein each of the sets of entries has a set eviction timestamp indicating a timestamp of a last first level indication removed from the set of entries in the first level data structure, wherein the adding the second level indication to the second level data structure, for a write address whose first level indication is removed from the first level data structure, is performed in response to determining that the set eviction timestamp is within the time window from the current time.

13. The apparatus of claim 12, wherein addresses include a tag and a set index, wherein the first level indication comprises the tag of the write address and wherein the set index of the write address is used to map the write address to one of a plurality of sets of entries in the first level data structure, wherein the second level indication comprises a hash of the tag and the set index for the first level indication being removed from the first level data structure.

14. A system, comprising:
 a host computer; and
 a non-volatile memory storage device coupled to the host computer, wherein the host computer communicates Input/Output (I/O) requests to the non-volatile memory storage device, comprising:
  a non-volatile memory;
  a memory controller to:
   include in a first level data structure first level indications of write addresses for locations in the non-volatile memory to which write requests have been directed;
   select a write address of the write addresses having a first level indication in the first level data structure based on a timestamp of the selected write address indicated in the first level data structure in response to there being no free entry in the first level data structure for a write address of a received write request;
   remove the first level indication of the selected write address from the first level data structure;
   add a second level indication for the selected write address to a second level data structure to free space in the first level data structure to indicate the write address for the received write request;
   use a first voltage level to read data from read addresses mapping to one of the first and second level indications in the first and the second level data structures, respectively; and
   use a second voltage level to read data from read addresses that do not map to one of the first and the second level indications the first and second level data structures, respectively.

15. The system of claim 14, wherein the first voltage level is used to read data for addresses that could possibly have been written to within a time window from a current time, wherein the second voltage level is used to read data for addresses that could not possibly have been written to within the time window from the current time, wherein the second voltage level is greater than the first voltage level, wherein the memory controller is further to:
  in response to determining that the use of the first voltage level failed to read data from a read address, use the second voltage level to read the data from the read address.

16. The system of claim 14, wherein the first level data structure stores a timestamp with each of the first level indications of the write addresses, wherein the timestamp indicates a portion of a plurality of portions of a time window from a current time during which the first level indication was added to the first level data structure, wherein there are a plurality of second level data structures, wherein the second level indication added to one of the second level data structures is for a write address having a timestamp indicated in the first level data structure within one of the portions of the time window.

17. The system of claim 16, wherein the memory controller is further to:
  after a passing of the portion of the time window, clear one of the second level data structures having second level indications for write addresses whose timestamps are prior to the time window from the current time.

18. The system of claim 16, wherein each address for the non-volatile memory maps to one of a plurality of sets of entries in the first level data structure, and wherein the selecting the write address, the removing the first level indication from the first level data structure, and the adding the second level indication to the second level data structure are performed in response to determining that there is no free entry in the set of entries to which a new write address maps, wherein a first level indication for the new write address is included in a free entry in the set of entries to which the new write address maps.

19. The system of claim 18, wherein each of the sets of entries has a set eviction timestamp indicating a timestamp of a last first level indication removed from the set of entries in the first level data structure, wherein the adding the second level indication to the second level data structure, for a write address whose first level indication is removed from the first level data structure, is performed in response to determining that the set eviction timestamp is within the time window from the current time.

20. A method for reading data written to a non-volatile memory, comprising:
  including in a first level data structure first level indications of write addresses for locations in the non-volatile memory to which write requests have been directed;
  selecting a write address of the write addresses having a first level indication in the first level data structure based on a timestamp of the selected write address indicated in the first level data structure in response to there being no free entry in the first level data structure for a write address of a received write request;
  removing the first level indication of the selected write address from the first level data structure;
  adding a second level indication for the selected write address to a second level data structure to free space in the first level data structure to indicate the write address for the received write request;
  using a first voltage level to read data from read addresses mapping to one of the first and second level indications in the first and the second level data structures, respectively; and
  using a second voltage level to read data from read addresses that do not map to one of the first and the second level indications the first and second level data structures, respectively.

21. The method of claim 20, wherein the first voltage level is used to read data for addresses that could possibly have been written to within a time window from a current time, wherein the second voltage level is used to read data for addresses that could not possibly have been written to within the time window from the current time, wherein the second voltage level is greater than the first voltage level, further comprising:
  in response to determining that the use of the first voltage level failed to read data from a read address, using the second voltage level to read the data from the read address.

22. The method of claim 20, wherein the first level data structure stores a timestamp with each of the first level indications of the write addresses, wherein the timestamp indicates a portion of a plurality of portions of a time window from a current time during which the first level indication was added to the first level data structure, wherein there are a plurality of second level data structures, wherein the second level indication added to one of the second level data structures is for a write address having a timestamp indicated in the first level data structure within one of the portions of the time window.

23. The method of claim 22, further comprising:
  after a passing of the portion of the time window, clearing one of the second level data structures having second level indications for write addresses whose timestamps are prior to the time window from the current time.

24. The method of claim 22, wherein each address for the non-volatile memory maps to one of a plurality of sets of entries in the first level data structure, wherein the selecting the write address, the removing the first level indication from the first level data structure and the adding the second level indication to the second level data structure, are performed in response to determining that there is no free entry in the set of entries to which a new write address maps, wherein a first level indication for the new write address is included in a free entry in the set of entries to which the new write address maps.

25. The method of claim 24, wherein each of the sets of entries has a set eviction timestamp indicating a timestamp of a last first level indication removed from the set of entries in the first level data structure, wherein the adding the second level indication to the second level data structure, for a write address whose first level indication is removed from the first level data structure, is performed in response to determining that the set eviction timestamp is within the time window from the current time.

* * * * *